United States Patent
Embleton et al.

(10) Patent No.: US 9,839,161 B2
(45) Date of Patent: Dec. 5, 2017

(54) THERMAL DUCTING FOR IMPROVED COOLING IN RACK DOMAINS

(71) Applicant: Dell Products L.P., Round Rock, TX (US)

(72) Inventors: Steven Embleton, Austin, TX (US); Rene Jason Salas, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 173 days.

(21) Appl. No.: 14/513,062

(22) Filed: Oct. 13, 2014

(65) Prior Publication Data
US 2016/0106007 A1 Apr. 14, 2016

(51) Int. Cl.
*H05K 5/00* (2006.01)
*H05K 7/20* (2006.01)

(52) U.S. Cl.
CPC ..... *H05K 7/20736* (2013.01); *H05K 7/20727* (2013.01)

(58) Field of Classification Search
CPC .................................... H05K 7/20745
USPC .......................................... 454/184
See application file for complete search history.

(56) References Cited

U.S. PATENT DOCUMENTS

| | | | | |
|---|---|---|---|---|
| 6,590,768 | B1* | 7/2003 | Wiley | G06F 1/183 257/E23.099 |
| 8,144,464 | B2* | 3/2012 | Vanderveen | H05K 7/20736 165/104.34 |
| 2009/0061755 | A1* | 3/2009 | Calder | H05K 7/20736 454/184 |
| 2014/0111930 | A1* | 4/2014 | Henderson | G06F 1/181 361/679.31 |
| 2015/0147954 | A1* | 5/2015 | Marrs | H05K 7/20727 454/284 |

OTHER PUBLICATIONS

"Switch Airflow Duct" by Dataracks at http://www.dcsawards.com/files/Dataracks%20-%20Air_duct_2013-118.pdf, printed Oct. 14, 2014, 1 page.
"The Use of In-Cabinet Ducting to Improve Inlet Air Temperatures" by Panduit at http://www.panduit.com/ccurl/960/552/D-RKAT02--WW-ENG%20DuctingforInletconds.pdf, Dec. 2012, 11 pages.
"Brocade VDX 8770-4 Four-Post Flush and Recessed Mount Intake Air Duct Rack Kit" by Brocade, Apr. 22, 2014, 24 pages.
"Rack Side Air Distribution 2U 115V 60HZ" by APC at http://www.apc.com/products/resource/include/techspec_index.cfm?base_sku=ACF201BLK&tab=models&page_type=print, printed Oct. 14, 2014, 2 pages.

* cited by examiner

*Primary Examiner* — Helena Kosanovic
(74) *Attorney, Agent, or Firm* — Baker Botts L.L.P.

(57) ABSTRACT

A thermal ducting rail receives a rack device in a rack chassis. The thermal ducting rail includes air flow guiding elements that enable cooling air from a front face of the rack chassis to be directed to an external side of the thermal ducting rail and from the external side to a rear face of the rack chassis. The thermal ducting rail enables rack devices equipped with side-to-side cooling to receive cooling air in a rack chassis with front-to-back cooling, without extending beyond a unit height occupied by the rack device.

19 Claims, 3 Drawing Sheets

THERMAL DUCTING FOR IMPROVED COOLING IN RACK DOMAINS

BACKGROUND

Field of the Disclosure

This disclosure relates generally to information handling systems and more particularly to thermal ducting for improved cooling in rack domains.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Many instances of information handling systems are installed in rack domains, such as in data centers. The rack chassis used in rack domains include cooling infrastructure for the enclosed information handling systems, such as air flow cooling within the rack chassis. Typical air flow cooling in a rack chassis is directed from front to back of the rack chassis.

SUMMARY

In one aspect, a disclosed thermal ducting rail for a rack chassis includes a front perforation to receive cooling air from the environment, the front perforation located at a front portion of the thermal ducting rail. The thermal ducting rail may also include a front duct to guide the cooling air to an external side of the thermal ducting rail. The front duct may be located at the external side. The thermal ducting rail may further include a rear perforation to receive the cooling air from the external side and enable the cooling air to exit the rear of the rack chassis, the rear perforation located at a rear portion of the thermal ducting rail.

In some embodiments, the thermal ducting rail includes a rear mounting element for a rack device, the rear mounting element enabling rear detention of the rack device when the rack device is installed in the thermal ducting rail. The rear mounting element may be adjustable along the thermal ducting rail. The thermal ducting may further include a spring included in the rear mounting element, the spring exerting forward force on the rack device when the rack device is installed in the thermal ducting rail.

In particular embodiments, the thermal ducting rail includes a front mounting element for the rack device, the front mounting element enabling front detention of the rack device when the rack device is installed in the thermal ducting rail. The front detention may secure a front edge of the rack device at a recessed position with respect to a front face of the rack chassis.

Other disclosed aspects include a rack chassis including a pair of thermal ducting rails.

BRIEF DESCRIPTION OF THE DRAWINGS

For a more complete understanding of the present invention and its features and advantages, reference is now made to the following description, taken in conjunction with the accompanying drawings, in which.

DESCRIPTION OF PARTICULAR EMBODIMENT(S)

Figure 1:
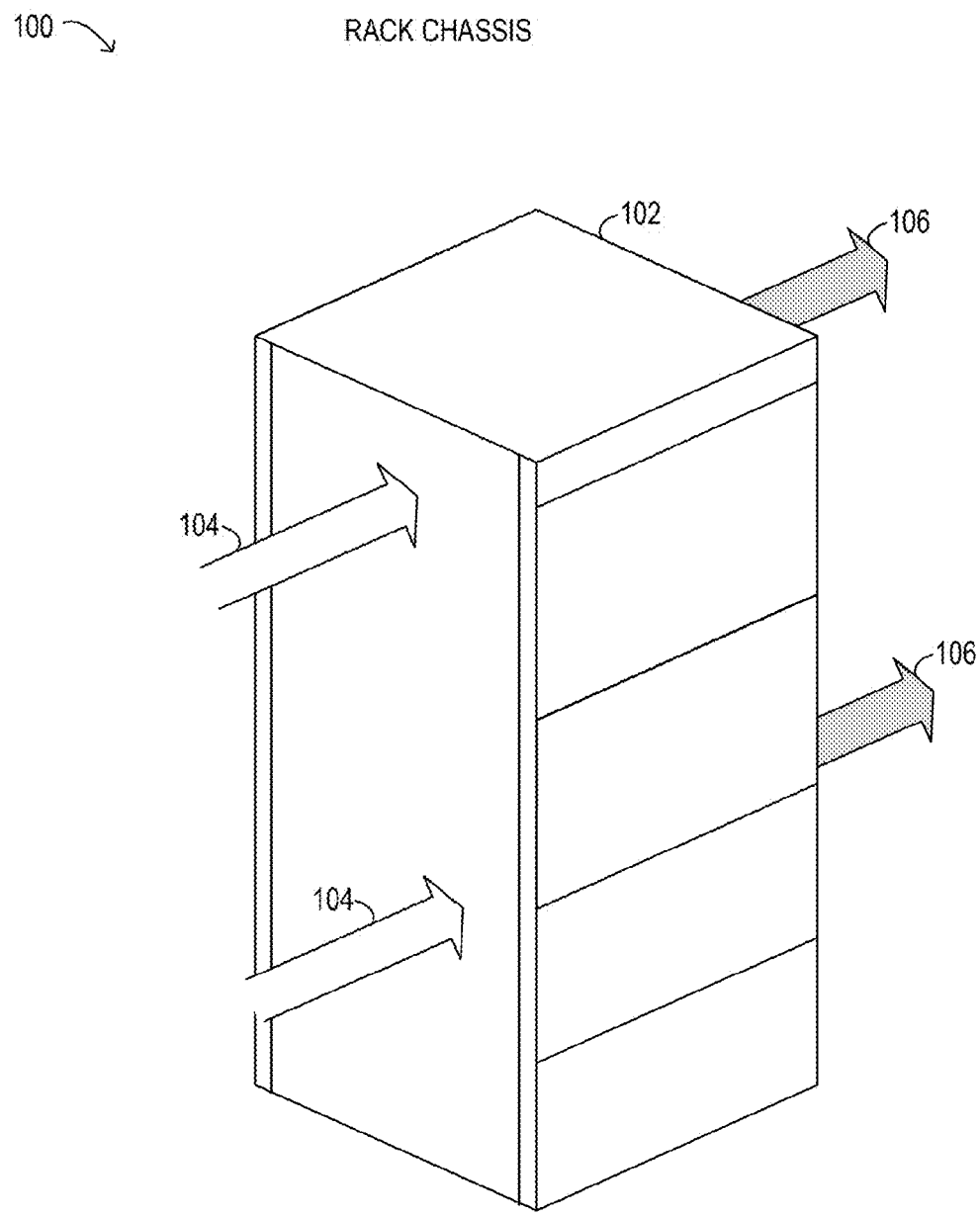
FIG. 1 is a block diagram of selected elements of an embodiment of rack chassis.

In the following description, details are set forth by way of example to facilitate discussion of the disclosed subject matter. It should be apparent to a person of ordinary skill in the field, however, that the disclosed embodiments are exemplary and not exhaustive of all possible embodiments.

Throughout this disclosure, a hyphenated form of a reference numeral refers to a specific instance of an element and the un-hyphenated form of the reference numeral refers to the element generically or collectively. Thus, as an example (not shown in the drawings), widget "12-1" refers to an instance of a widget class, which may be referred to collectively as widgets "12" and any one of which may be referred to generically as a widget "12". In the figures and the description, like numerals are intended to represent like elements.

As noted previously, the rack chassis used in rack domains include cooling infrastructure for the enclosed information handling systems. When air flow cooling in a rack chassis is used, air flow is typically directed from front to back of the rack chassis. The air flow cooling is used to dissipate heat generated by rack devices housed in the rack chassis, such as modular information handling systems, which are specifically designed to operate with the front-to-back cooling air flow arrangement.

However, other rack devices that use side-to-side air flow cooling may also be housed in a rack chassis, such as various types of network switches, among other examples. The side-to-side air flow cooling may rely upon ventilators and corresponding duct openings at the side faces of such rack devices. When such a side-to-side cooled rack device is introduced into a typical front-to-back cooled rack chassis, the side-to-side cooling may not operate as intended. For example, the side-to-side ventilation may not receive a desired amount of cooling air, due to physical obstructions in the mounting elements of the rack chassis. A further complication is that such side-to-side cooled rack devices may be mounted at a front face of the rack chassis for ease of access and serviceability. Some solutions that attempt to accommodate for side-to-side cooled rack devices within a front-to-back cooled rack chassis may introduce ducting or air flow elements that occupy an undesired amount of space or are limited to particular mounting arrangements of rack devices, for example. Furthermore, solutions that extend ducting or air flow elements beyond the rack space occupied by the rack device are undesirable because installation and serviceability of such solutions may affect operation of other existing rack devices, which may involve significant disadvantages for equipment operators who may desire a high degree of modularity and independence among installed rack devices.

As will be described in further detail, the inventors of the present disclosure have invented a thermal ducting rail that provides improved cooling for rack devices. The rack devices may be side-to-side cooled rack devices or may be side-cooled rack devices. The thermal ducting rail disclosed herein enables cooled air at a front face of a rack chassis to reach side ventilation elements in a rack device. The thermal ducting rail disclosed herein may further enable the cooled air to escape at a rear face of the rack chassis. The thermal ducting rail disclosed herein may secure the rack device at an offset position with respect to the front face of the rack chassis, thereby enabling the cooling air to be drawn in to a front duct included with the thermal ducting rail. The front duct may enable the cooling air to reach the rack device via an external side of the thermal ducting rail within the rack chassis. The thermal ducting rail disclosed herein may be contained within a unit rack space occupied by the rack device and may be installed and serviced within the unit rack space.

Figure 2A:
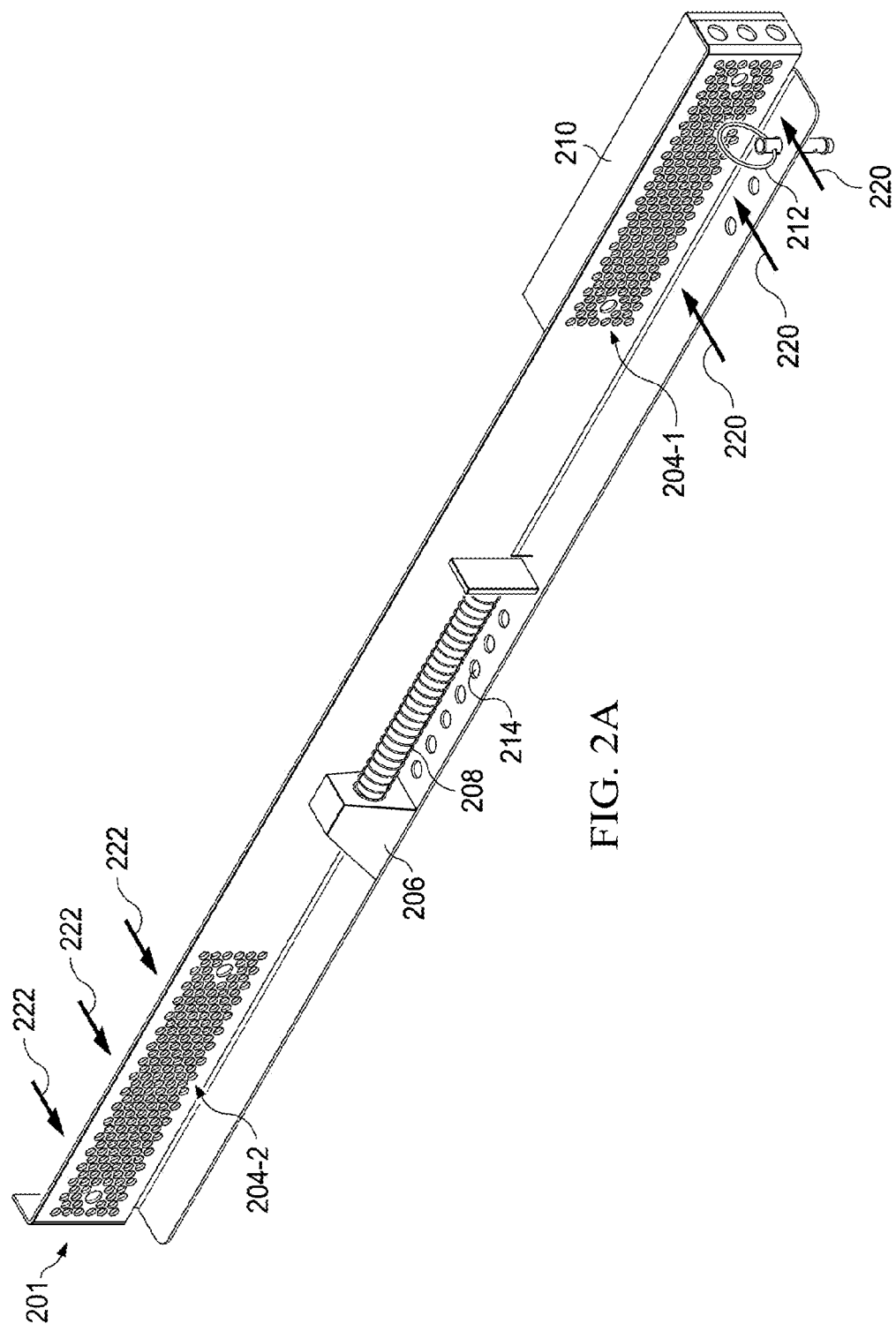
FIG. 2A is a perspective view of a thermal ducting rail.
Figure 2B:
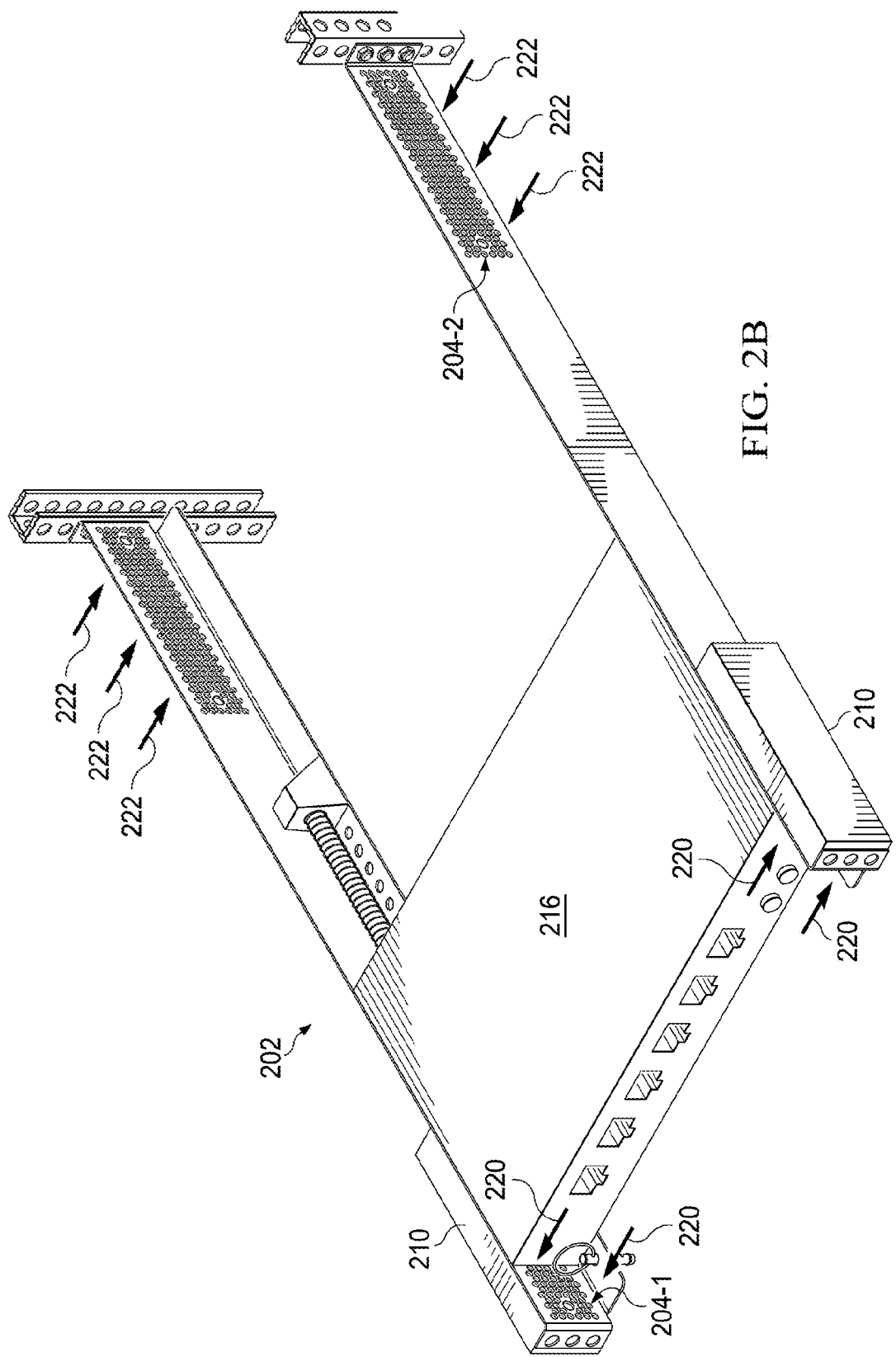
FIG. 2B is a perspective view of an installation in a rack chassis of a pair of thermal ducting rails.

Particular embodiments are best understood by reference to FIGS. 1, 2A, and 2B wherein like numbers are used to indicate like and corresponding parts.

Turning now to the drawings, FIG. 1 illustrates a block diagram depicting selected elements of an embodiment of rack chassis system 100. As shown, rack chassis system 100 may comprise rack chassis 102 for receiving rack devices. In various embodiments, rack chassis 102 is a cabinet that receives 19-inch wide rack devices having varying unit rack heights (also referred to as "unit height" or "U"). Although rack chassis 100 is shown in a basic configuration and unpopulated by rack devices for descriptive clarity in FIG. 1, it will be understood that rack chassis 100 may include various mounting elements, cable routing elements, cooling elements, etc.

In FIG. 1, rack chassis 102 is shown with cooling air flow. Specifically, cool air 104 is shown entering rack chassis 102 at a front face and exiting rack chassis 102 as warm air 106 at a rear face after being heated by heat dissipated by installed rack devices (not shown). It is noted that rack devices may be received within rack chassis 102 at either the front face or the rear face. In various embodiments, such as in a data center, a plurality of rack chassis 102 may be installed and populated with equipment in the form of rack devices. In some installations, the plurality of rack chassis 102 is arranged in rows with side faces of rack chassis 102 placed immediately next to one another. In this manner, a row may receive an aisle of cool air 104 and may vent an aisle of warm air 106. The separation of cool air 104 and warm air 106 may facilitate desired arrangements of large clusters of rack chassis 102, for example, by facilitating efficient arrangements and scaling of ventilation and cooling infrastructure used in data centers.

As will be described in further detail, rack chassis 102 may include rack devices installed using thermal ducting rails, as described herein. In this manner, rack chassis 102 may support front-to-back cooled rack devices as well as side-to-side cooled rack devices. Furthermore, because the thermal ducting rails used to receive rack devices do not physically extend beyond a unit rack height of the corresponding rack device, rack chassis 102 may be used to house a relatively high density of rack devices with adequate cooling, irrespective of a cooling orientation of an individual rack device. Furthermore, rack chassis 102 using the thermal ducting rails disclosed herein may enable any desired arrangement or orientation of various rack devices, without limitation of position within the rack. For example, rack chassis 102 using the thermal ducting rails disclosed herein may enable a front-to-back cooled rack device to be installed adjacent to a side-to-side cooled rack device.

Referring now to FIG. 2A, a perspective view of selected elements of an embodiment of thermal ducting rail 201 is presented. As shown, thermal ducting rail 201 may be used at one side portion of a rack device for installation in a rack chassis, such as rack chassis 102 (see FIG. 1). In certain embodiments thermal ducting rail 201 may be used with another thermal ducting rail (see FIG. 2B) that is a mirror image of thermal ducting rail 201 at an opposing side portion of the rack device. In other embodiments, thermal ducting rail 201 may be used with a conventional rail at the opposing side portion. Although thermal ducting rail 201 is shown having a particular unit height in FIG. 2A, it will be understood that thermal ducting rail 201 may be implemented for any desired unit height in different embodiments.

As shown, thermal ducting rail 201 may include perforations 204 that enable cooling air to flow from within a rack space occupied by the rack device or from an internal side of thermal ducting rail 201 to an external side space within the rack chassis or to an external side of thermal ducting rail 201. In the embodiment depicted in FIG. 2A, thermal ducting rail 201 is shown with front perforation 204-1 and rear perforation 204-2. Front perforation 204-1 and rear perforation 204-2 may both extend vertically to the unit height. At least one of front perforation 204-1 and rear perforation 204-2 may extend vertically to less than the unit height. Rear perforation 204-2 may extend horizontally from a rear portion of thermal ducting rail 201 towards the front of thermal ducting rail 201. Front perforation 204-1 may extend horizontally from a front portion of thermal ducting rail 201 towards the back of thermal ducting rail 201. At front perforation 204-1, duct 210 may be installed at an external side edge of thermal ducting rail 201 and may coextend the same horizontal length as front perforation 204-1 and may coextend the same vertical height as front perforation 204-1.

When the rack device is mounted in thermal ducting rail 201, a front edge of the rack device facing a front face of the rack chassis may be recessed to horizontal distance less than a width of front perforation 204-1, or to about half the width of front perforation 204-1. As a result of the recessed mounting of the rack device in thermal ducting rail 201, a portion of front perforation 204-1 is exposed at the front face of the rack chassis and may draw in cooling air 220 at the front face. The drawn in cooling air 220 is guided by duct 210 and may mix with warm air escaping out of the rack device, which may employ side-to-side cooling. In some embodiments, a location of front perforation 204-1 and duct 210 may correspond to a location of a side ventilation element, such as a cooling air outlet or a ventilator, included with the rack device. In this manner, the side ventilation element of the rack device may be exposed to cooling air 220 drawn in by the rack chassis. Furthermore, because the external side where duct 210 is located is normally closed from the environment, duct 210 may direct cooling air 220 towards rear perforation 204-2, where cooling air 222 may be drawn back into the rack space behind a rear face of the rack device, from where cooling air 222 may exit at a rear face of the rack chassis. In this manner, a guided air flow for cooling air 220, 222 may be achieved using thermal ducting rail 201 that may be consistent with the front-to-back cooling arrangement of the rack chassis and may avoid undesired mixing of cool air and warm air.

Also shown included with thermal ducting rail 201 is rear mounting element 206, which may be adjustably fixed to thermal ducting rail 201 using mounting holes 214. Rear mounting element 206 may represent a fixed detention element for the rear face of the rack device when installed within thermal ducting rail 201. Rear mounting element 206 may be adjusted according to a size of the rack device such that the front edge or front face of the rack device is situated within the horizontal length of front perforation 204-1. In certain embodiments, rear mounting element 206 may include spring 208 that provides a forward force on the rack device when installed. The forward force may enable the rack device to protrude forward when released, thereby enabling ease of removal of the rack device from the recessed position. The spring may employ any of a variety of release mechanisms, including front mounting element 212, which may represent a fixed detention element for the front face of the rack device. Front mounting element 212 may be a pin or other detention element and may be adjustable for a desired position of the rack device.

Referring now to FIG. 2B, a perspective view of selected elements of an embodiment of installation 202 is presented. Installation 202 depicts rack device 216 mounted in a rack chassis using a pair of thermal ducting rails 201 (see FIG. 2A). It is noted that in other arrangements of installation 202, rack device 216 may be mounted using one thermal ducting rail 201 at one side and another type of rail at an opposing side (not shown). In FIG. 2B, rack device 216 is visible in the recessed position while a portion of front perforation 204-1 is exposed to the environment at a front face of the rack chassis, enabling cooling air 220 to be drawn in. Also visible in FIG. 2B is duct 210, which may guide cooling air 220 from the front face of the rack chassis towards rear perforation 204-2 and back out of the rear face of the rack chassis as cooling air 222, as explained above. FIG. 2B also shows how the use of thermal ducting rails 201 is confined to the unit height of rack device 216 and does not affect other installed rack devices or rack components.

As disclosed herein, a thermal ducting rail receives a rack device in a rack chassis. The thermal ducting rail includes air flow guiding elements that enable cooling air from a front face of the rack chassis to be directed to an external side of the thermal ducting rail and from the external side to a rear face of the rack chassis. The thermal ducting rail enables rack devices equipped with side-to-side cooling to receive cooling air in a rack chassis with front-to-back cooling, without extending beyond a unit height occupied by the rack device.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A thermal ducting rail for rack chassis, the thermal ducting rail comprising:
   a front perforation to receive cooling air from the environment from a front portion of a rack chassis, the front perforation located on the thermal ducting rail at a front portion of the thermal ducting rail;
   a front duct to guide the cooling air received from the environment by the front perforation to an external side of the thermal ducting rail and along the external side of the thermal ducting rail toward a rear portion of the rack chassis, wherein the front duct is located at the external side of the thermal ducting rail and does not extend beyond the front portion of the thermal ducting rail; and
   a rear perforation to:
      receive the cooling air guided by said front duct along the external side of the thermal ducting rail at an internal side of the thermal ducting rail behind a rear face of a rack device that is separate from the thermal ducting rail and is installed in the thermal ducting rail; and
      enable the cooling air to exit at the rear portion of the rack chassis behind the rear face of the rack device, the rear perforation located at a rear portion of the thermal ducting rail;
   wherein the thermal ducting rail receives the rack device for installing, at one side of the rack device, the rack device into the thermal ducting rail while the thermal ducting rail is installed in the rack chassis.

2. The thermal ducting rail of claim 1, further comprising:
   a rear mounting element for a rack device, the rear mounting element enabling rear detention of the rack device when the rack device is installed in the thermal ducting rail, and wherein the rear mounting element is adjustable along the thermal ducting rail.

3. The thermal ducting rail of claim 2, further comprising:
   a spring included in the rear mounting element, the spring exerting forward force on the rack device when the rack device is installed in the thermal ducting rail.

4. The thermal ducting rail of claim 2, further comprising:
   a front mounting element for the rack device, the front mounting element enabling front detention of the rack device when the rack device is installed in the thermal ducting rail, wherein the front detention secures a front edge of the rack device at a recessed position with respect to a front face of the rack chassis.

5. The thermal ducting rail of claim 4, wherein the recessed position of the front edge of the rack device is within the front perforation.

6. The thermal ducting rail of claim 1, wherein the front duct extends horizontally to a length corresponding to the front perforation.

7. The thermal ducting rail of claim 1, wherein the thermal ducting rail is sized vertically for a unit height in the rack chassis, and wherein the front duct and the front perforation extend vertically to the unit height.

8. The thermal ducting rail of claim 7, wherein the rear perforation extends vertically to the unit height.

9. A rack chassis, comprising:
   a pair of thermal ducting rails for receiving a rack device that is separate from the pair of thermal ducting rails for installing, at respective sides of the rack device, the rack device into the pair of thermal ducting rails while the thermal ducting rails are installed in the rack chassis, at least one of the pair of thermal rails comprising:
      a front perforation to receive cooling air from the environment from a front portion of the rack chassis, the front perforation located on the thermal ducting rail at a front portion of the thermal ducting rail;
      a front duct to guide the cooling air received from the environment by the front perforation to an external side of the thermal ducting rail and along the external side of the thermal ducting rail toward a rear portion of the rack chassis, wherein the front duct is located at the external side of the thermal ducting rail and does not extend beyond the front portion of the thermal ducting rail; and a rear perforation to:

receive the cooling air guided by said front duct along the external side of the thermal ducting rail at an internal side of the thermal ducting rail behind a rear face of a rack device that is separate from the thermal ducting rail and is installed in the thermal ducting rail; and enable the cooling air to exit at the rear portion of the rack chassis behind the rear face of the rack device, the rear perforation located at a rear portion of the thermal ducting rail.

10. The rack chassis of claim 9, at least one of the pair of thermal rails comprising:

a rear mounting element for the rack device, the rear mounting element enabling rear detention of the rack device when the rack device is installed in the pair of thermal ducting rails, and wherein the rear mounting element is adjustable along the thermal ducting rail.

11. The rack chassis of claim 10, at least one of the pair of thermal rails comprising:

a spring included in the rear mounting element, the spring exerting forward force on the rack device when the rack device is installed in the pair of thermal ducting rails.

12. The rack chassis of claim 9, at least one of the pair of thermal rails comprising:

a front mounting element for the rack device, the front mounting element enabling front detention of the rack device when the rack device is installed in the pair of thermal ducting rails, wherein the front detention secures a front edge of the rack device at a recessed position with respect to a front face of the rack chassis.

13. The rack chassis of claim 12, wherein the recessed position of the front edge of the rack device is within the front perforation.

14. The rack chassis of claim 9, wherein the front duct extends horizontally to a length corresponding to the front perforation.

15. The rack chassis of claim 9, wherein the thermal ducting rail is sized vertically for a unit height in the rack chassis, and wherein the front duct and the front perforation extend vertically to the unit height.

16. The rack chassis of claim 15, wherein the rear perforation extends vertically to the unit height.

17. The rack chassis of claim 9, wherein the pair of thermal ducting rails are symmetrically equipped with respect to each other.

18. The thermal ducting rail of claim 1, wherein the front portion of the thermal ducting rail comprising the front perforation is perpendicular to a front edge of the rack device when the rack device is installed in the thermal ducting rail.

19. The rack chassis of claim 9, wherein the front portion of the thermal ducting rail comprising the front perforation is perpendicular to a front edge of the rack device when the rack device is installed in the pair of thermal ducting rails.

* * * * *